United States Patent [19]

Beyer et al.

[11] Patent Number: 5,012,203
[45] Date of Patent: Apr. 30, 1991

[54] DISTRIBUTED AMPLIFIER WITH ATTENUATION COMPENSATION

[75] Inventors: James B. Beyer, Madison, Wis.; Steven Deibele, Albuquerque, N. Mex.

[73] Assignee: Wisconsin Alumni Research Foundation, Madison, Wis.

[21] Appl. No.: 457,270

[22] Filed: Dec. 27, 1989

[51] Int. Cl.$^5$ .............................................. H03F 3/60
[52] U.S. Cl. ...................................... 330/286; 330/54; 330/277
[58] Field of Search ................. 330/53, 54, 84, 124 R, 330/277, 286, 295

[56] References Cited

U.S. PATENT DOCUMENTS

| | | | |
|---|---|---|---|
| 3,255,421 | 6/1966 | Skalski | 330/34 |
| 3,564,442 | 2/1971 | Germann | 330/35 |
| 3,833,858 | 9/1974 | Gandhi et al. | 330/286 |
| 3,986,133 | 10/1976 | Roza et al. | 330/286 |
| 4,311,966 | 1/1982 | Bert et al. | 330/286 |
| 4,423,386 | 12/1983 | Gerard | 330/54 |
| 4,446,445 | 5/1984 | Apel | 330/269 |
| 4,486,719 | 12/1984 | Ayasli | 330/286 |
| 4,532,480 | 7/1985 | Gerard | 330/286 |
| 4,540,954 | 9/1985 | Apel | 330/286 |
| 4,543,535 | 9/1985 | Ayasli | 330/53 |
| 4,595,881 | 6/1985 | Kennan | 330/54 |
| 4,658,220 | 4/1987 | Heston et al. | 330/286 X |
| 4,675,911 | 6/1987 | Sokolov et al. | 455/325 |
| 4,752,746 | 6/1988 | Niclas | 330/277 |
| 4,754,234 | 6/1988 | Gamand | 330/286 |
| 4,769,618 | 9/1988 | Parish et al. | 330/277 |
| 4,780,684 | 10/1988 | Kosmahl | 330/54 |
| 4,788,511 | 11/1988 | Schindler | 330/277 |
| 4,847,568 | 7/1989 | Nazoa-Ruiz | 330/277 |

OTHER PUBLICATIONS

James B. Beyer, et al., "MESFET Distributed Amplifier Design Guidelines," IEEE *Transactions on Microwave Theory and Techniques,* vol. MTT-32, vol. 3, Mar. 1984, pp. 268-275.
Ayasli, et al., "Monolithic 2-20 GHz GaAs Traveling-Wave Amplifier," Electronics Letters, vol. 18, No. 14, Jul. 8, 1982, pp. 596-598.
E. W. Strid, et al., "A DC-12 GHz Monolithic GaAs-FET Distributed Amplifier," IEEE Transactions on Electron Devices, vol. ED. 29, No. 7, Jul. 1982, pp. 1065-1071.
Y. Ayasli, et al., "A Monolithic GaAs 1-13-GHz Traveling-Wave Amplifier," IEEE Transactions on Microwave Theory and Techniques, vol. MTT-30, No. 7, Jul., 1982, pp. 976-981.
J. B. Beyer, et al., "Y Band Monolithic Microwave Amplifier Study," University of Wisconsin-Madison, Dept. ECE, Report No. ECE-83-6, 1983.
B. Kim, et al., "0.5W 2-21 GHz Monolithic GaAs Dis- (List continued on next page.)

*Primary Examiner*—Steven Mottola
*Attorney, Agent, or Firm*—Foley & Lardner

[57] ABSTRACT

A distributed amplifier has a plurality of amplifying sections which are connected between input and output lines comprising artificial transmission line sections. Input line attenuation compensation is provided by negative resistance compensation circuits which are connected to the input line. The compensation circuits provide negative resistance on the input line which substantially compensates for the attenuation that occurs along the input line, thereby substantially increasing the available gain and bandwidth of the distributed amplifier. Negative resistance output line attenuation compensation may also be provided, such as by utilizing a cascode amplifying circuit including a first common-source connected FET and a second common-gate connected FET, with the common-gate FET connected to the output line. The utilization of output line attenuation compensation provides further capacity for increasing the gain and bandwidth of the distributed amplifier.

33 Claims, 8 Drawing Sheets

OTHER PUBLICATIONS tributed Amplifier," Electronics Letters, vol. 20, No. 7, Mar., 1984, pp. 288–289.

J. B. Beyer, et al., "MESFET Distributed Amplifier Design Guidelines," IEEE Transactions on Microwave Theory and Techniques, vol. MTT-32, No. 3, Mar. 1984, pp. 268–275.

W. Kennan, et al., "A 2-18-GHz Monolithic Distributed Amplifier Using Dual-Gate GaAs FET's," IEEE Transactions on Electron Devices, vol. ED-31, No. 12, Dec. 1984, pp. 1926–1930.

B. Kim, et al., "High Power Distributed Amplifier Using MBE Synthesized Material," NIEE Microwave Millimeterwave Monolithic Circuits Symposium Digest, St. Louis, Mo., 1985, pp. 35–37.

R. C. Becker, et al., "On Gain-Bandwidth Product for Distributed Amplifiers," IEEE Transactions on Microwave Theory and Techniques, vol. MTT-34, No. 6, Jun., 1986, pp. 736–738.

M. J. Schindler, et al., "A 15 to 45 GHz Distributed Amplifier Using 3 FETS of Varying Periphery," in 1986 IEEE GaAs IC Symposium, pp. 67–70.

E. M. Chase, et al., "A Power Distributed Amplifier Using Constant-R Networks," in 1986 IEEE MTT-S International Microwave Symposium Digest, pp. 811–815.

R. A. Larue, et al., "A 12-dB High-Gain Monolithic Distributed Amplifier," IEEE Transactions on Microwave Theory and Techniques, vol. MTT-34, No. 12, Dec. 1986, pp. 1542–1547.

T. McKay, et al., "A High-Performance 2-18.5-GHz Distributed Amplifier—Theory and Experiment," IEEE Transactions on Microwave Theory and Techniques, vol. MTT-34, No. 12, Dec. 1986, pp. 1559–1568.

S. G. Bandy, et al., "A 2-20 GHz High-Gain Monolithic HEMT Distributed Amplifier," IEEE Transaction on Microwave Theory and Techniques, vol. MMT-35, No. 12, Dec. 1987, pp. 1494–1499.

DISTRIBUTED AMPLIFIER WITH ATTENUATION COMPENSATION

This invention was made with U.S. Government support awarded by the Department of the Navy, Contract No.: N00014-87-C-0157. The U.S. Government has certain rights in this invention.

FIELD OF THE INVENTION

This invention pertains generally to the field of electronic amplifiers, particularly of the type adapted for use at microwave frequencies, and more specifically to distributed amplifiers.

BACKGROUND OF THE INVENTION

Three factors have inhibited improvements in the gain, power output and bandwidth of monolithic distributed amplifiers: input line attenuation, output line attenuation, and the dynamic (linear) range of the input signal. The primary loss mechanisms of the input and output lines are the transistor loadings rather than the (microstrip) interconnecting line losses. Advanced transistor design is an important way in which distributed amplifier performance can be improved, but is not the only means available.

A typical conventional distributed amplifier circuit consists of periodically spaced field-effect transistors (FETs) which are connected by electrically short, high impedance microstrip lines. The design of such conventional amplifiers is generally discussed in, for example, the article by J. B. Beyer, et al., "MESFET Distributed Amplifier Design Guidelines" IEEE Trans. Microwave Theory Tech., Vol. MTT-32, March, 1984, pp. 268-275, which is incorporated herein by reference. A distributed amplifier may be qualitatively described as a set of artifical input and output transmission lines which are coupled by (FET) transconductances. A schematic view of a typical conventional distributed amplifier having an arbitrary number of sections 'n' is shown in FIG. 1. The amplifier has an input port 10, an output port 11, an input line 14 consisting of a series of high impedance microstrip artificial transmission lines 15, an output line 17 composed of a series of high impedance microstrip lines 18, an image matching port 20 on the output line having an image matching impedance and DC drain bias source 21 connected to ground, an image matching port 23 on the input line having an image matching impedance and DC gate bias source 24 connected to ground, and a series of field effect transistors (FETs) 26 connected in a common-source configuration. The drains of each FET are connected by microstrip lines 28 to junction nodes between the microstrips 18 of the output line, and the gates are connected by connecting lines 29 to junction nodes between the input line microstrips 15. The terminations 21 and 24 are standard and well known in the art, and various gate and drain biasing circuits may be used. See, e.g., the biasing and termination circuits shown in U.S. Pat. Nos. 4,543,535, 4,595,881, and 4,486,719. The conventional distributed amplifier of FIG. 1 and the present invention are illustrated utilizing microstrip transmission lines although, of course, lumped inductance and capacitance transmission lines may also be used.

Other analyses of the design fundamentals and tradeoffs of distributed amplifier designs are given in R. C. Becker, et al., "On Gain-Bandwidth Product for Distributed Amplifiers," IEEE Trans. Microwave Theory Tech., Vol. MTT-34, June, 1986, pp. 736-738; J. B. Beyer, et al., "Wideband Monolithic Microwave Amplifier Study," University of Wisconsin-Madison, Dept. ECE, Report No. ECE-83-6 1983. A conclusion drawn from the foregoing papers is that the input (gate) and output (drain) line attenuation parameters $A_g$ and $A_d$ control the gain and bandwidth of the conventional distributed amplifier. The maximum DC gain is related to the value of $A_d$, i.e., inversely proportional to the function sinh $[A_d(0\ Hz)/2]$. Lower output loss FETs, higher image impedances, and/or higher gain FETs are necessary to extend the DC gain limits in the conventional distributed amplifier design. At higher frequencies, the impact of the input line attenuation $A_g$ is more pronounced. A reduction of $A_g$ would allow higher distributed amplifier operating frequencies.

SUMMARY OF THE INVENTION

In accordance with the present invention, the performance of distributed amplifiers is improved by reducing the attenuation factor $A_g$ and, preferably, the attenuation factor $A_d$ of each section of the distributed amplifier from that which is obtained from a corresponding conventional amplifier using the same amplifying elements (e.g., FETs) and image impedances. Reduction of the section attenuation factors is accomplished by incorporating active impedances along the loaded input and output lines to reduce or essentially cancel the attenuation. Such active impedances, characterized by frequency-dependent reactances and negative resistances, reduce the net attenuation terms by compensating the signal losses dominated by the positive transistor resistances $R_i$ and $R_{ds}$. Such attenuation compensation is referred to herein as "negative resistance compensation".

The effect of negative resistance compensation on distributed amplifiers is twofold. First, by lessening the attenuation on one or both of the input or output lines, more sections can be usefully added to a single distributed amplifier stage. The increase single-stage gain thereby achieved permits a proportional maximum output power increase in those amplifiers which would otherwise be limited by the dynamic (linear) range of the input signal. The maximum amplifier output power is then given by the expression $G_p P_{in(max)}$, which is proportional to the single-stage amplifier power gain $G_p$ and to the (limited) maximum input signal strength $P_{in(max)}$. The second effect achieved with negative resistance loss compensation is an extension of the bandwidth of the amplifier. Broad band loss compensation on either distributed amplifier line permits significant bandwidth increases.

The distributed amplifier of the present invention is composed of a selected number of amplifier sections connected together on one side by an input line and on the other side by an output line. Negative resistance compensation means are electrically connected to the input line at a node at or between each of the multiple sections to partially or substantially cancel the input line attenuation. An exemplary negative resistance compensation circuit includes an FET in a common-gate configuration, with the drain connected to the node between input line transmission line sections and the source connected to an appropriate source biasing impedance which is perferably a large impedance across a very broad band of frequencies. The source termination may be formed, for example, by a transmission line selected to be a quarter-wavelength in length at the center of the desired band, with the transmission line terminated by relatively large capacitance. This allows the FET to be biased without power losses in biasing resistors while nonetheless maintaining very broadband negative resistance compensation.

To further increase the performance of distributed amplifiers in the present invention, attenuation compensation of the output line may be provided actively within the distributed amplifier sections. In accordance with the present invention, output line compensation is perferably accomplished by utilizing an amplifying circuit which includes a cascode FET configuration consisting of a common-source FET, a short transmission line and a common-gate configured FET. The combination of the common-gate FET with the primary amplifying common-source FET has several advantages. The source-to-drain signal transmission of the common-gate FET is greater than unity magnitude across a large frequency span, whereas the reverse transmission remains small. Therefore, connecting the drain of a common-source FET to the source of the common-gate FET improves the net signal amplification and the reverse isolation. The short transmission line, referred to as the cascode line, joins the two transistors, altering the cascode forward gain and the output impedance because of impedance transformation. The high gain cascode circuit displays effective negative resistance output impedances at moderate to high frequencies because of the common-gate FET output block.

Further objects, features, and advantages of the invention will be apparent from the following detailed description when taken in conjunction with the accompanying drawings.

DETAILED DESCRIPTION OF THE INVENTION

Figure 1:
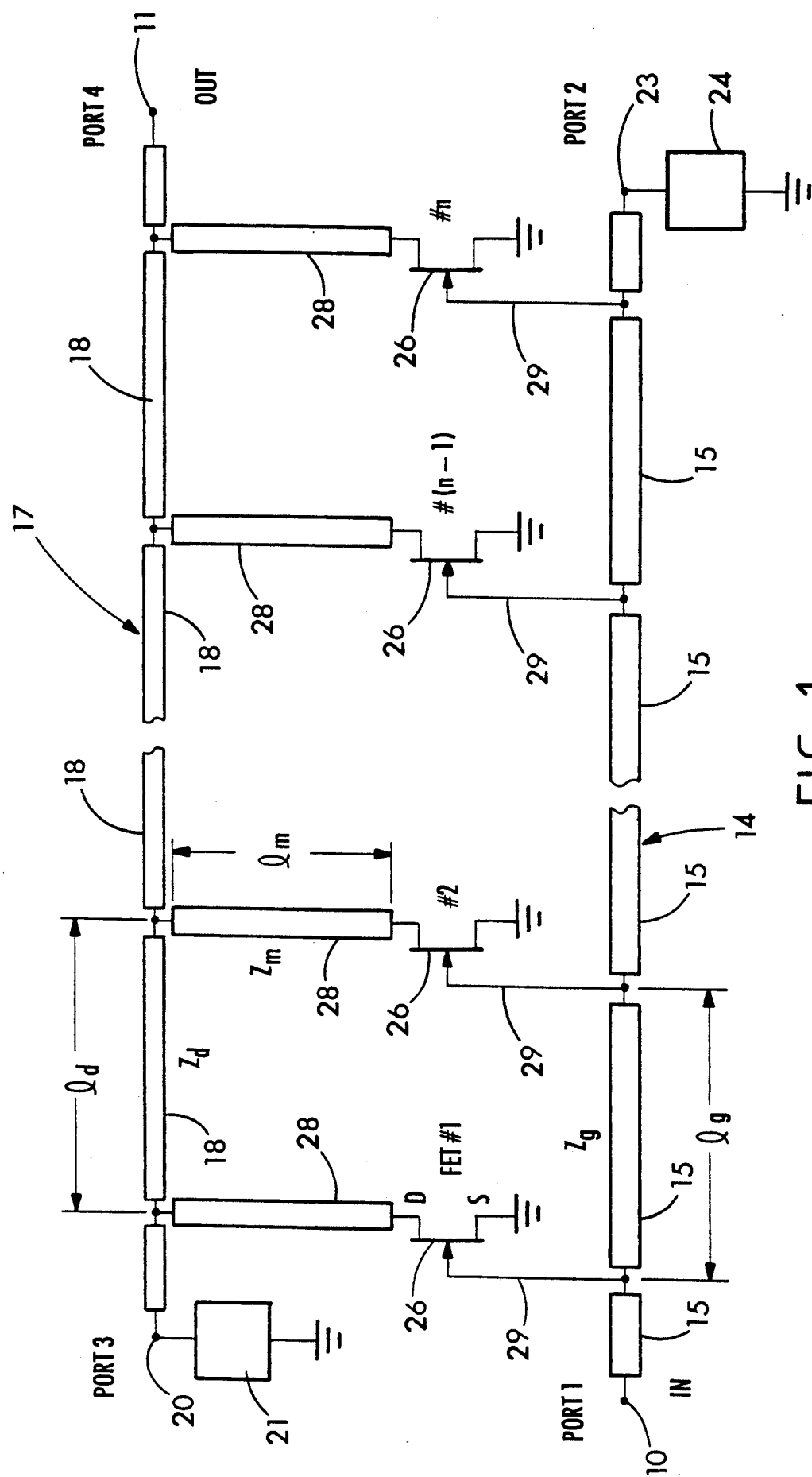
FIG. 1 is a schematic circuit diagram of a conventional (prior art) n-section distributed amplifier.
Figure 2:
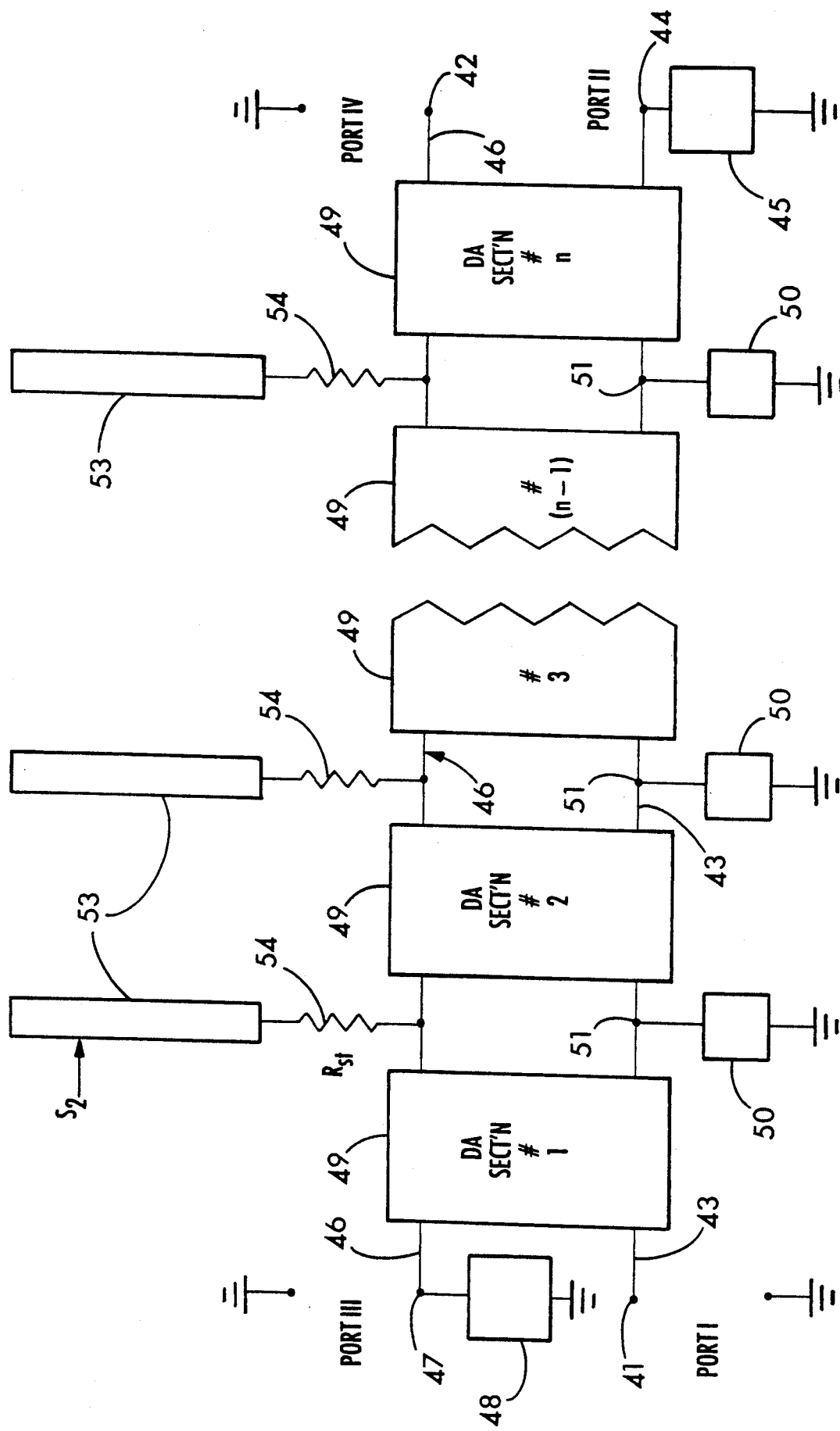
FIG. 2 is a schematic circuit diagram of the general configuration of a distributed amplifier in accordance with the present invention.

A schematic circuit diagram of a compensated distributed amplifier in accordance with the present invention is shown in a general block diagram form in FIG. 2, having an input port 41 (port I) and an output port 42 (port IV). Input port 41 is connected to an input line 43, the other end of which forms a port 44 (port II) to which an image matching impedance and gate bias circuit 45 may be connected. The output port 42 is connected to an output line 46, the other end of which terminates in a port 47 (port III) to which an image matching impedance and drain bias circuit 48 may be connected. A series of distributed amplifier sections 49 are connected in the input and output lines 43 and 46 between the input and output ports. A negative resistance input line compensation circuit 50 is electrically connected to the input line 43 between each of the distributed amplifier sections at nodes 51 which are spaced along the input line. As explained further below, the negative resistance compensation circuit 50 compensates for the attenuation in the input line that occurs through the various sections of the distributed amplifier. The amplifier may also include open-ended microstrip stubs 53, having effective stub resistances shown separately at 54, to provide a desired level of capacitance, on an output line formed of microstrips.

The active negative resistance compensation circuits 50 reduce the net attenuation by compensating for signal losses dominated by the positive transistor resistances. The use of these negative resistance compensation circuits can lessen the attenuation on the input line, thereby allowing more sections to be added to a single distributed amplifier stage. The increased single-stage gain permits a proportional maximum output power increase in those amplifiers which are limited by the dynamic (linear) range of the input signal. Negative resistance loss compensation also extends the effective bandwidth of the amplifier.

Figure 3:
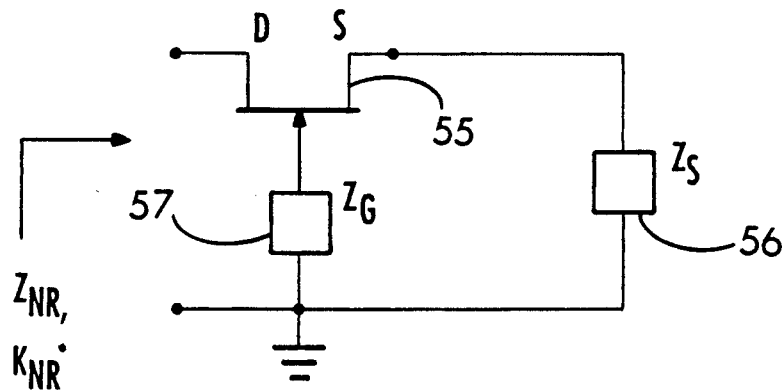
FIG. 3 is a circuit diagram of a common-gate FET circuit which can be utilized as the negative resistance compensation circuit in accordance with the invention.
Figure 4:
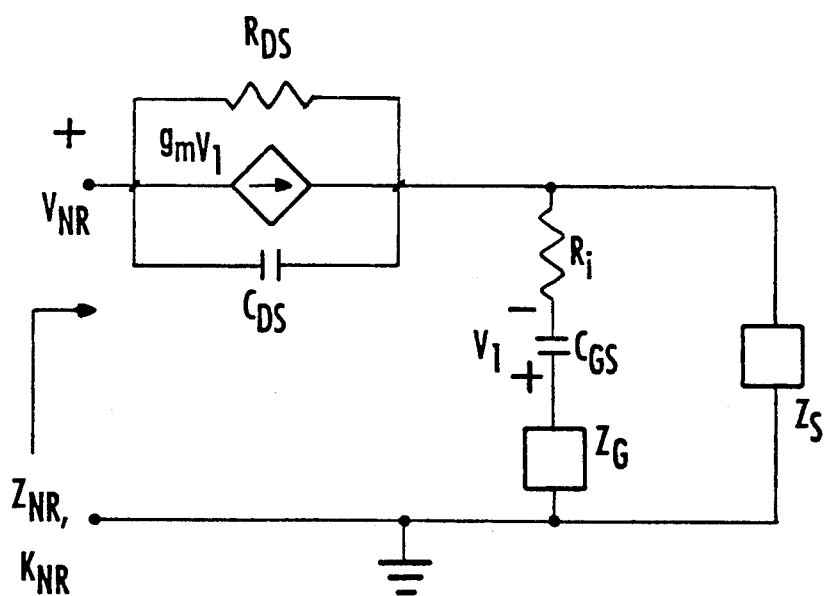
FIG. 4 is a simplified equivalent circuit for the FET circuit of FIG. 3.

The negative resistance circuit of 50 can be implemented utilizing the common-gate FET circuit of FIG. 3, which includes the FET 55, a source termination impedance 56 of effective complex impedance $Z_s$, and a gate to ground impedance 57 of effective complex impedance $Z_g$. A simplified equivalent circuit (with ideal circuit elements) for this circuit structure is given in FIG. 4.

When driven at its drain terminal, the circuit of FIG. 3 can provide a negative resistance and a capacitance over a wide band of frequencies. Loading the artificial transmission lines of a distributed amplifier with this circuit results in a considerable reduction in attenuation with minimal dispersion. The following equation gives the resulting input impedance, $Z_{nr}$:

$$Z_{nr} = \frac{R_{ds}}{1 + j\omega C_{ds}R_{ds}} \left[ 1 + \frac{g_m Z_s}{1 + j\omega C_{gs}(R_i + Z_s + Z_g)} \right] +$$

$$\frac{Z_s[1 + j\omega C_{gs}(R_i + Z_g)]}{1 + j\omega C_{gs}(R_i + Z_s + Z_g)}.$$

The impedances $Z_g$ and $Z_s$ model the bias and termination loads. Assuming these to be passive, only the voltage-dependent current generator (via the term $g_m$) contributes to the formation of an active impedence $Z_{nr}$. The interplay of the elements in FIG. 4 can be determined directly from the equation above. However, insight into the nature of $Z_{nr}$ is more readily obtained by examining $Z_{nr}$ under a few specific conditions, namely low-frequency excitation and the case of infinite source terminating impedance $Z_s$.

At very low frequencies, the common-gate circuit provides insufficient loss compensation. This is seen by allowing the frequency to approach zero in the equation above, resulting in $$Z_{nr}(f \rightarrow 0Hz) = R_{ds}(1 + g_m Z_s) + Z_s.$$

Assuming the phase of gm to be given by $-\omega\tau$ ($\tau$ is the FET transit time), then only in the case of highly reactive source impedance loading could Re$\{Z_{nr}\}$ be negative at low frequencies. The dependence of $Z_{nr}$ on the large drain-to-source resistance $R_{ds}$ indicates that negative resistance circuits load the distributed amplifier lines minimally at low frequencies.

A second specific condition to examine is when the source termination $Z_s$ becomes infinite. Computer simulations indicate that a large $|Z_s|$ is appropriate for negative resistance compensation across very broad bands. Small values of $|Z_s|$ tend to decrease the available negative resistance loss compensation because a small, nonresonant source load $|Z_s|$ degrades the voltage division of the input signal across the FET gate-to-source capacitor. The result is a decreased normalized current generator drive ratio $|V_l/V_{nr}|$. When $|Z_s|$ approaches infinity, the equation for $Z_{nr}$ simplifies to the form $$Z_{nr} = \frac{R_{ds}}{1 + j\omega C_{ds}R_{ds}} + \frac{1}{j\omega C_{gs}} + R_i + Z_g +$$

$$\frac{g_m R_{ds}}{j\omega C_{gs}[1 + j\omega C_{ds}R_{ds}]}.$$

The first four terms of the foregoing equation are passive in nature, while the fifth term (involving $g_m$) provides the negative resistance. The real part of the fifth term is $$Re\left[\frac{g_m R_{ds}}{j\omega C_{gs}[1 + j\omega C_{ds}R_{ds}]}\right] = -\frac{g_m R_{ds}/(\omega_d C_{gs})}{(1 + j\omega/\omega_d)(1 - j\omega/\omega_d)}$$

where, as before, $\omega_d 1/(R_{ds}C_{ds})$. For $\omega \geq j2\omega_d$, the negative resistance term decreases approximately as $1/\omega^2$. Consequently, one can expect an upper frequency to exist at which the net resistance Re $\{Z_{nr}\}$ becomes positive. Computer simulations of a Honeywell monolithic 0.25×100 μm MODFET equivalent circuit show that the net negative resistance Re $\{Z_{nr}\}$ extends beyond 70 GHz with various source terminating loads. This FET is discussed further below.

Low-gain FET's provide insufficient loss compensation for practical use as common-gate negative resistance circuits. In fact, very low gain FET's cannot overcome the losses attributed to the circuit components $R_{ds}$, $R_i$, and $Z_g$. This is because the negative resistance term is proportional to $g_m$. In contrast, as $C_{gs}$ decreases, the negative resistance circuit compensation increases via a larger reflection. This effect may be explained by voltage division concepts: higher impedance gate-to-source capacitances experience greater $|V_l/V_{nr}|$ ratios and thus provide larger current generator drive.

Figures 5, 6:
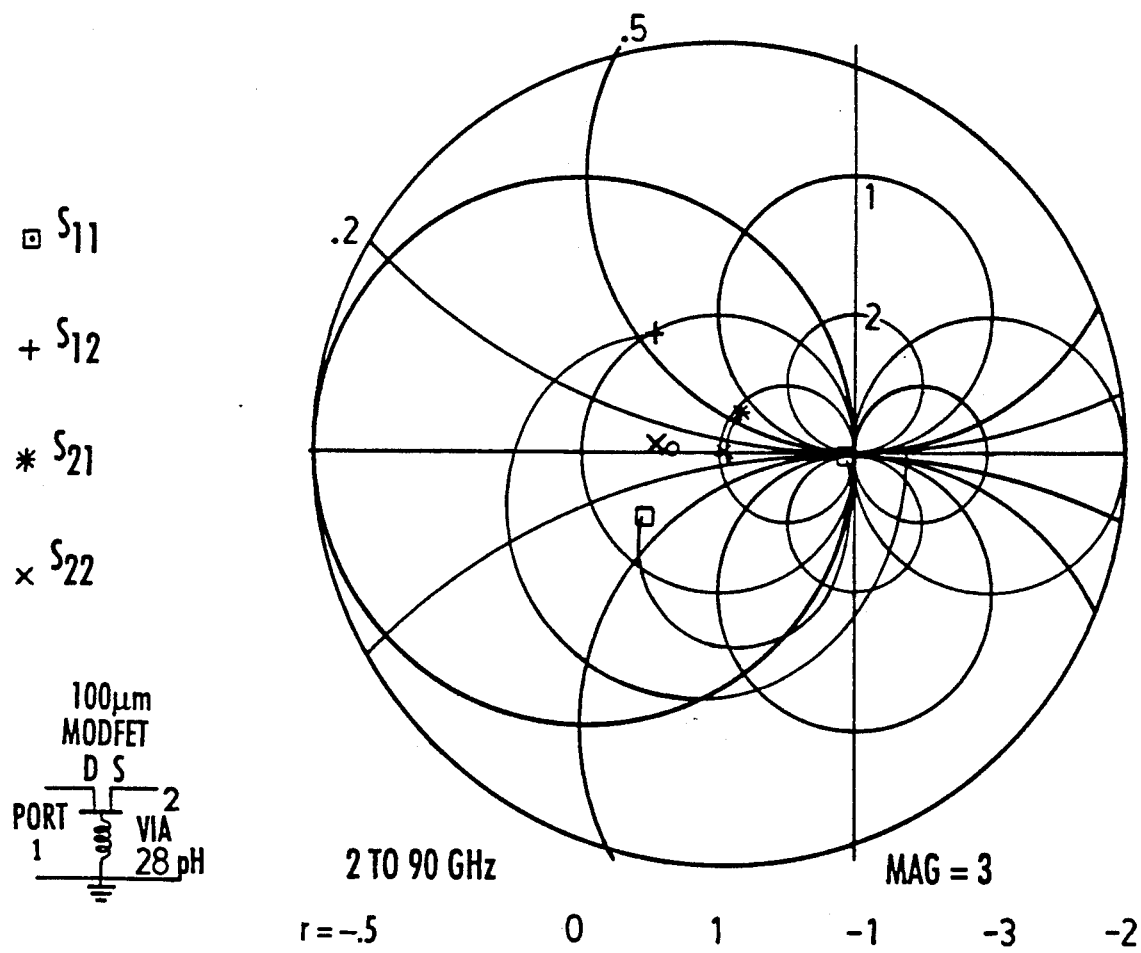
FIG. 5 is a circuit schematic for a Honeywell monolithic MODFET in a common-gate configuration which can be used in the compensation circuit of FIG. 3.
FIG. 6 is a graph of the simulated scattering parameters for the circuit of FIG. 5.

The simulated scattering parameters shown in the graph of FIG. 6 for the MODFET of FIG. 5 also describe the common-gate circuit characteristics. By terminating port 2 with a reflective load $K_1$, one obtains a net input reflection coefficient, $K_{in}$, at port 1:

$$K_{in} = S_{11} + S_{12}S_{21}K_1/(1 - S_{22}K_1).$$

Figure 7:
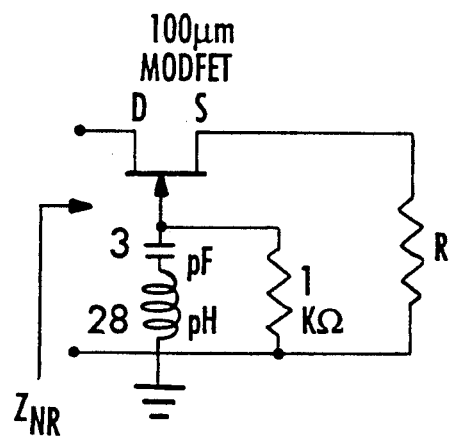
FIG. 7 is a circuit schematic of a biased MODFET as in FIG. 5 using resistive source termination.
Figure 8:
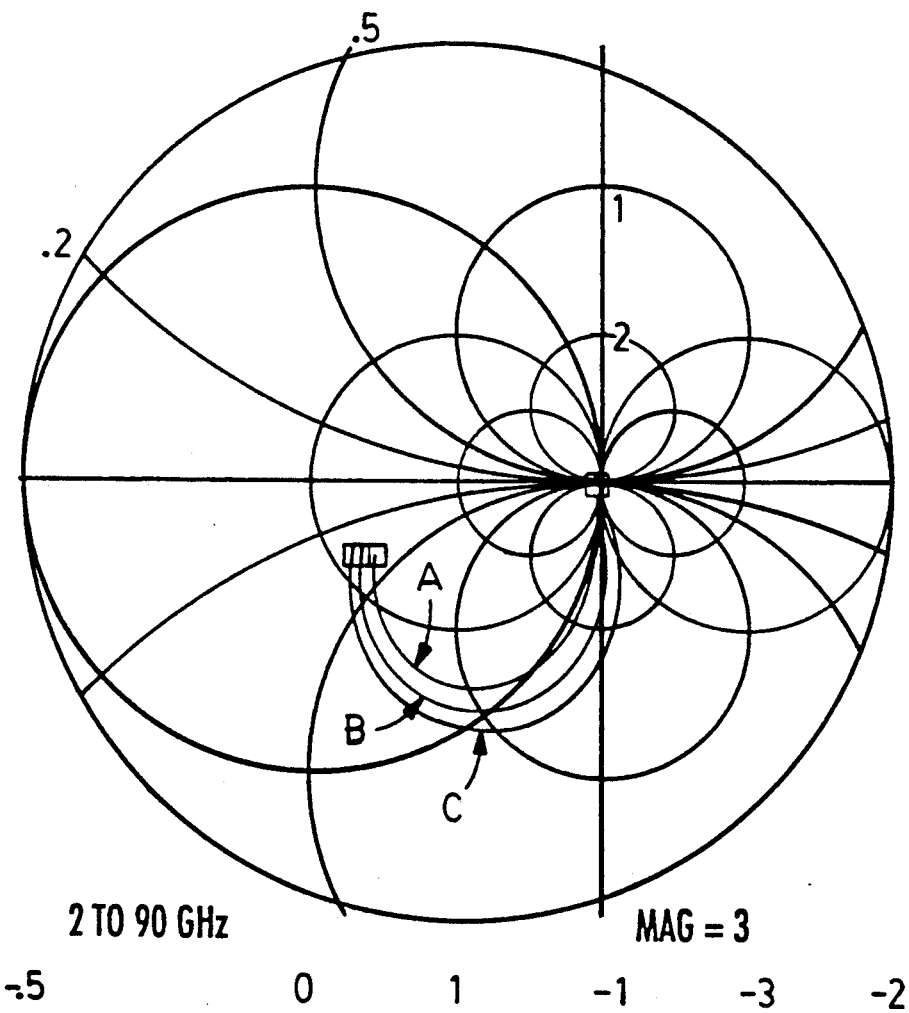
FIG. 8 is a graph of the simulated reflections of the circuit of FIG. 7.
Figure 9:
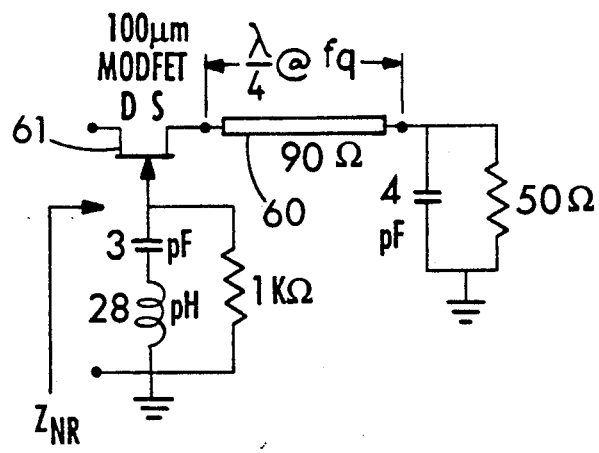
FIG. 9 is a circuit schematic of a MODFET as in FIG. 5 employing a quarter-wavelength transmission line source bias circuit and a gate bias circuit.
Figure 10:
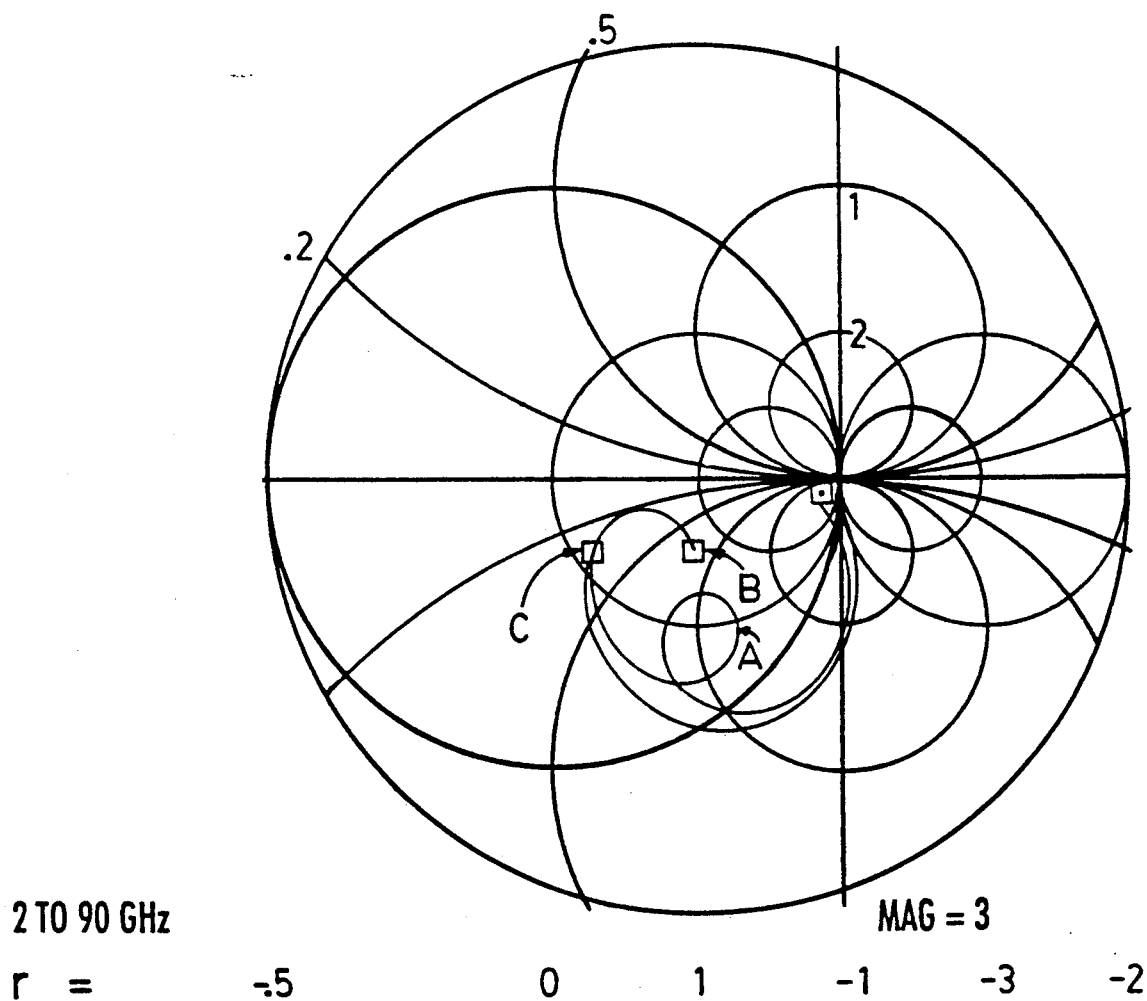
FIG. 10 is a graph of simulated reflections of the circuit of FIG. 9 for particular biasing component values.

The nonzero $S_{12}S_{21}$ term obtained from the parameters of FIG. 6 indicates that source terminations can influence the negative resistance behavior. The simulated net input reflection curves of FIG. 8 for the circuit of FIG. 7 and of FIG. 10 for the circuit of FIG. 9 demonstrate this. FIG. 8 shows the useful broad-band negative resistance compensation available using resistive source terminations. In the simulations of FIG. 10 the source termination is formed by a quarter-wavelength (at band center) transmission line terminated by a large capacitance. This allows one to provide FET bias without power losses in bias resistors while maintaining very broad band negative resistance compensation. For the graph of FIG. 8, utilizing the representative circuit elements and values shown in FIG. 7, the curve marked A in FIG. 8 is for resistance R=50 ohms, curve B is for resistance R=150 ohms, and curve C is for resistance R which approaches infinity. For the graph of FIG. 10, the circuit of FIG. 9 is illustrated for bias load $R_f$ of 50 ohms, a capacitance $C_{2nr}$ of four picofarads (pF) a bias resistance $R_{bias}$ of 1 kilo-ohms (k ), a coupling capacitance $C_{lr}$ of 3 pF, and effective inductance to ground of 28 picohenrys (pH). The transmission line 60 connected to the source of the MODFET 61 perferrably has a length equal to a quarter of the wavelength at the center frequency of the bandwidth of interest and an effective resistance of 90 ohms. In FIG. 10, curve A represents an effective center frequency $f_q = 30$ GHz, curve B is for a center frequency $f_q = 45$ GHz, and curve C is for center frequency $f_q = 90$ GHz.

Figure 11:
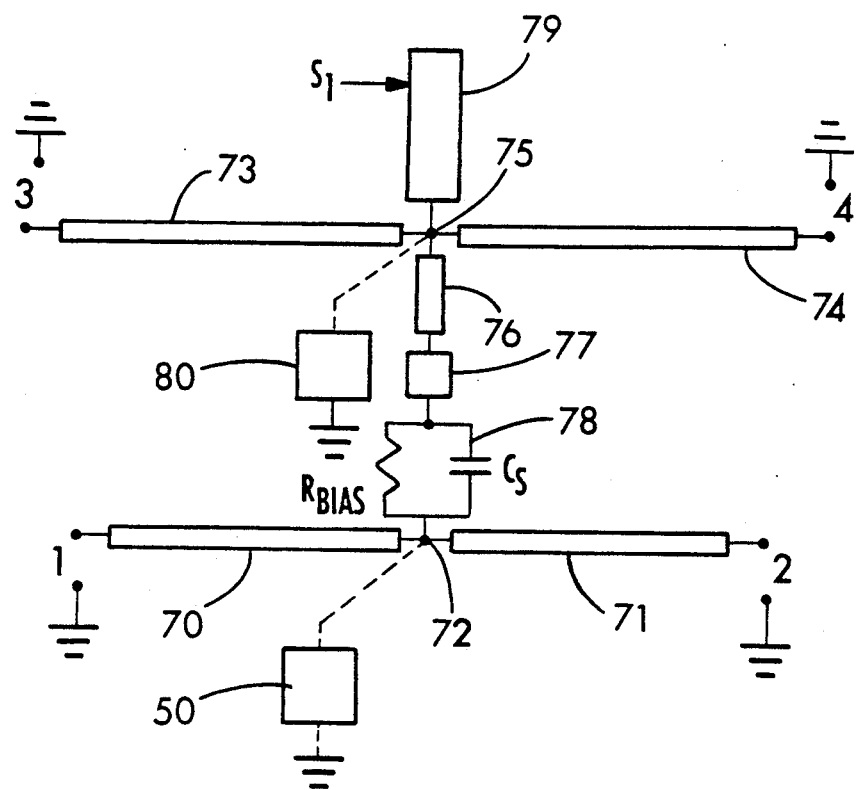
FIG. 11 is a schematic circuit diagram of a preferred distributed amplifier gain section in accordance with the invention.

An exemplary circuit diagram for the sections 49 of the distributed amplifier is shown in FIG. 11. Each of the sections includes input line artificial transmission line segments 70 and 71 (TL$_1$) joined at a common node 72, output line artificial transmission line segments 73 and 74 (TL$_2$) joined at a node 75, and a transmission line segment 76 (TL$_3$), an amplifying circuit 77 and a biasing circuit 78 connected between the nodes 72 and 75. An open ended stub transmission line segment 79 is preferably connected to the node 75 to provide a desired capacitance. By utilizing an amplifying circuit 78 which provides effective negative resistance compensation, output line compensation can be attained. Alternatively, a negative resistance compensation circuit 80, similar to the circuit 50 for input line compensation, may be connected to the output line to provide compensation. As also shown in FIG. 11, the input line compensation circuit 50 may be connected to the node 50 to which the amplifying circuit 77 is connected. The microstrip transmission lines are formed on a semiconductor substrate in a conventional manner, and the other circuit elements may also be formed utilizing conventional integrated circuit processing techniques. See the article by J. B. Beyer, et al., "MESFET Distributed Amplifier Design Guidelines," supra.

Figure 12:
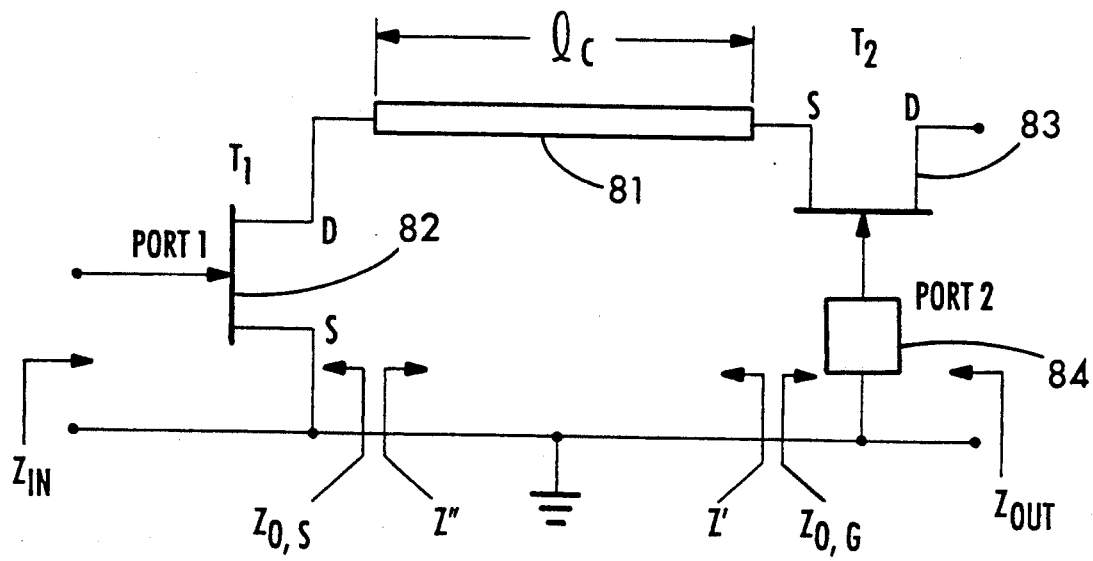
FIG. 12 is a schematic circuit diagram of a preferred amplifying circuit for utilization in the distributed amplifier gain section of FIG. 11.
Figure 13:
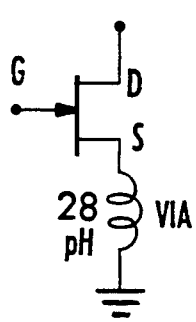
FIG. 13 is an exemplary alternative simple common-source FET configuration which may be utilized as the amplifying circuit in the amplifier gain section of FIG. 11.
Figure 14:
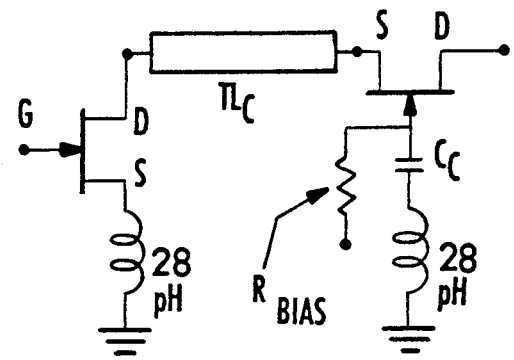
FIG. 14 is a circuit schematic for an amplifying circuit as in FIG. 12 with illustrative biasing components.

With regard to output line loss compensation, incorporating a common-gate negative resistance circuit with the primary amplifying circuit (a common-source FET) is advantageous in several respects. The source-to-drain signal transmission of the common-gate FET ($S_{12}$ of FIG. 6) is greater than unity magnitude across a large frequency span, whereas the reverse transmission ($S_{21}$ of FIG. 6) remains small. Therefore, connecting the drain of a common-source FET to the source of the common-gate FET can improve the net signal amplification and the reverse isolation. The resulting preferred amplifying circuit 77, depicted in FIG. 12, is the cascode configuration. The short transmission line 81, referred to as the cascode line, separates the two transistors 82 and 83, altering the cascode forward gain and the output impedance because of the impedance transformations from $Z_{o,g}$ to $Z''$ and $Z_{o,s}$ to $Z'$, respectively. A bias impedance 84 provides DC bias resistance and an AC short. High gain cascodes display negative resistance output impedances at moderate to high frequencies because of the common-gate FET output block.

The use of dual-gate FET's and cascodes in distributed amplifier applications has been proposed previously, with a cited advantage being the increased output impedance over that of a common-source FET for increased gain and bandwidth. See, e.g., W. Keenan, et al., "A 2-18 GHz Monolithic Distributed Amplifier Using Dual-Gate GaAs FET's," IEEE Trans. Electron Devices, Vol. ED-31, pp. 1926–1930, December, 1984; R. A. LaRue, et al., "A 12-dB High Gain Monolithic Distributed Amplifier," IEEE Trans. Microwave Theory Tech., Vol. MTT-34, pp. 1542–1547, December, 1986; E. M. Chase, et al., "A Power Distributed Amplifier Using Constant-R Networks," in 1986 IEEE MTT-S Int. Microwave Symp. Dig., pp. 811–815. The cascode output, a common-gate FET, thus functions as a type of attenuation-compensation network for compensation of the output line attenuation.

For stability, one desires the net input reflection coefficients at the four distributed amplifier ports to have less than unity magnitude. This translates to four series of conditions, each involving three port terminations and the 16 distributed amplifier S parameters. Such analyses are very complex and not easily adapted to graphical techniques. In addition, these extensive analyses may be of little practical use with distributed amplifiers because of the extreme S parameter variations across the wide bands of operation, especially the phase variations.

A simplified analysis provides insight into the stability conditions. Here the net input reflection at the jth port of the amplifier, $K_{in,j}$, is approximated by $$K_{in,j} = S_{jj} + \sum_{\substack{m=1 \\ m \neq j}}^{4} S_{mj} K_{L,m} S_{jm}.$$

The term $S_{kl}$ is a four-port scattering parameter and $K_{L,m}$ is the reflection coefficient of the mth port termination. Stable, nonoscillatory behavior is maintained when $|K_{in,j}|$ is less than unity for each of the four ports.

When the phases of the four addends in the equation above are equal, the largest reflection magnitude $|K_{in,j}|$ occurs. This constructive addition of reflection terms leads to the four most stringent stability conditions:

$$|K_{in,j}| = |S_{jj}| + \sum_{\substack{m=1 \\ m \neq j}}^{4} |S_{mj} K_{L,m} S_{jm}| \overset{\text{set}}{<} 1, j = \{1,2,3,4\}.$$

Assuming the four-port scattering parameters to be given, the foregoing equation establishes limitations on the set of port termination tolerances $\{|K_{L,m}|\}$ which are based upon the transmission factors $\{|S_{mj}S_{jm}|\}$. The stability criteria have been formulated. The question remains how one specifies port termination tolerances which guarantee stable, insensitive amplifier operation. From the system standpoint, a uniform restriction on port terminations is desirable. This leads to the specification of a maximum termination reflection coefficient, $K_{L,max}$, for all four ports:

$$K_{L,max} \geq |K_{L,j}|, j = \{1,2,3,4\}.$$

A tolerance can be derived as:

$$K_{L,max} = \min \left[ [1 - |S_{jj}|max] / \left( \sum_{\substack{m=1 \\ m \neq j}}^{4} |S_{mj}S_{jm}| \right) \right]$$

for $j = \{1,2,3,4\}$. When all four ports are terminated by loads with reflection magnitudes less than $K_{L,max}$, stable, nonoscillatory behavior is maintained. Therefore the term $K_{L,max}$ is a stability criterion. The last equation above indicates stability improvement with decreasing $\{|S_{jj}|\}$ and $\{|S_{mj}S_{jm}|\}$. Because the trends of the four-port scattering parameters vary with frequency, it is desirable to calculate a few values of $K_{L,max}$ based upon midband and upper band edge S parameters.

The transistor characteristics and the distributed amplifier configuration play dominating roles in determining $K_{L,max}$. The transistor gains, isolations, and parasitic loading impedances influence the set of transmission factors $\{S_{jm}S_{mj}\}$, which in turn govern $K_{L,max}$. Similarly, the amplifier configuration strongly influences the set $\{S_{jm}S_{mj}\}$. Amplifiers employing input line compensation display an increased $|S_{21}S_{12}|$ term. Likewise, distributed amplifiers with output line compensation (via cascodes) possess an increased $|S_{43}S_{34}|$ value Not only are the line transmission factors affected by loss compensation, but other pairs of transmission magnitudes may be increased.

A cascode distributed amplifier with the following midband characteristics provides an example of the application of the foregoing principles for stability calculations: $S_{41}(dB) = S_{22}(dB) = 10$, $S_{14}(dB) = S_{23}(dB) < -25$, $S_{11}(dB) = S_{22}(dB) < -15$, $S_{44}(dB) = S_{33}(dB) < -15$, $|S_{21}| = |S_{12}| = 0.7$, $|S_{43}| = |S_{34}| = 1.2$, $S_{31}(dB) = S_{42}(dB) < 7$, and $S_{13}(dB) = S_{24}(dB) < -30$. Using the equations for stability set forth above, a value of $K_{L,max} = 0.487$ is found, which guarantees stable, nonoscillatory operation at midband frequencies.

Figure 15:
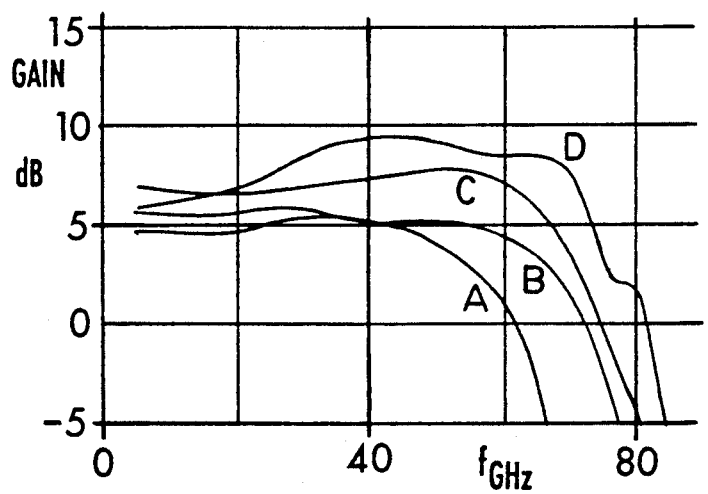
FIG. 15 are graphs of the frequency responses of four-section distributed amplifiers having four different configurations.

Seven millimeter-wave distributed amplifiers were simulated and optimized with the aid of the TOUCHSTONE computer program. Each design employs the scaled equivalent circuits of Honeywell 0.25×100 monolithic MODFET's. A maximized performance four-section conventional design serves as the basis for comparison. In FIG. 15 the gains of the conventional distributed amplifier and of three loss compensated amplifiers, each employing four sections, are given. In this graph Curve A is a conventional configuration, Curve B is a (input line) compensated configuration, Curve C is a cascode-based configuration, and Curve D is a (input line) compensated cascode configuration. Three loss compensated amplifiers employing eight sections are compared to the conventional, four-section distributed amplifier in FIG. 16. Curve A is a conventional configuration (four sections), Curve B is a (input line) compensated configuration (eight sections), Curve C is a cascode configuration (eight sections), and Curve D is a compensated cascode configuration (eight sections). The small sizes of the transistors comprising the seven amplifiers were in part responsible for the very high frequencies achieved. Details of the seven amplifier designs are given below.

Curve A of FIG. 15 displays the conventional distributed amplifier frequency response, which exhibits a gain of 5.25 dB to 45 GHz. This amplifier has been maximized for gain-bandwidth product (GBWP), achieving a value of 82.4 GHz, and serves as the standard for single-stage response within this transistor family. Because the bandwidth of this amplifier equals the maximum operating frequency, the GBWP equals the gain-maximum operating frequency product (GMFP).

Curve B of FIG. 15 is the gain of the distributed amplifier using input line compensation. The compensation consists of common-gate transistor circuits 50 placed on the input line midway between the amplifying common-source FET's. Here the 4.85 dB gain extends to 60 GHz, resulting in sigle-stage GBWP and GMFP increases of 27 percent, to 104.9 GHz.

The frequency response of a cascode-based distributed amplifier is found in curve C of FIG. 15. The 7.18 dB gain of this four-section "cascode distributed amplifier" covers 27 to 62 GHz. This gives a GBWP of 80.0 and a GMFP of 141.7 GHz. The GMFP for this amplifier is 71 percent greater than that of the conventional distributed amplifier. A high frequency loss was introduced into the output line of the cascode distributed amplifier to stabilize the onset of the cascode negative resistance output impedance.

Curve D of FIG. 15 displays the response of a cascode-based distributed amplifier which is also compensated on the input line with common-gate negative resistance circuits. This amplifier, termed the compensated cascode distributed amplifier, does not provide exceptional gain flatness. Nonetheless, an improved 8.9 dB gain performance between 30 and 65 GHz is achieved. This represents a GBWP of 97.3 GHz and a GMFP of 180.7 GHz, improvements of 18 percent and 119 percent over those of the conventional design. The low frequency slope of curve D may be attributed to the onset and gradual increase of negative resistance loss compensation from the common-gate FET's throughout this sample frequency span.

Figure 16:
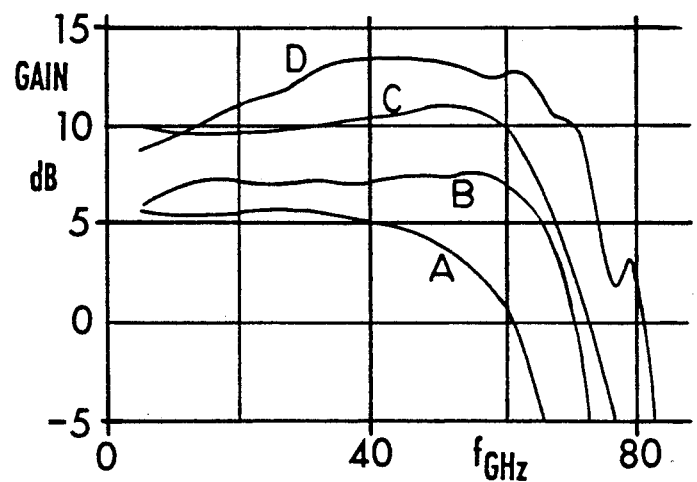
FIG. 16 are graphs showing the frequency responses for comparison purposes of four different distributed amplifiers, one conventional configuration having four sections and the others each having eight sections.

FIG. 16 is a comparison of the conventional, four-section distributed amplifier with three compensated distributed amplifiers, each using eight sections. Because negative resistance compensation reduces attenuation, an increase in the optimum number of sections results. Hence the full advantage of negative resistance compensation can only be realized if the number of active devices is increased. Curve A is the optimized conventional distributed amplifier (the same as FIG. 15, curve A). Curve B is the frequency response of the distributed amplifier which uses input line compensation only. The increase from four sections to eight accounts for the gain increase between curve B of FIG. 15 and curve B of FIG. 16. The MODFET output loss prohibits large gain increases with additional distributed amplifier sections. Curve C of FIG. 16 is the eight-section cascode distributed amplifier response. Here the usual number of amplifier sections in a stable design is governed by the input line attenuation. Lastly, curve D of FIG. 16 shows the response of the eight-section compensated cascode distributed amplifier. This design shows a low frequency gain slope.

Referring to FIG. 16, the compensated amplifier has a 7.15 dB gain between 10 and 62 GHz, corresponding to a GBWP of 118.4 GHz and a GMFP of 141.2 GHz. These are 43 percent and 71 percent greater, respectively, than those of the conventional design. The eight-section cascode distributed amplifier has a gain of 10.71 dB across the 35 to 60 GHz span, yielding a GBWP of 85.8 GHz and GMFP of 205.9 GHz, improvements of 4.1 percent and 150 percent over the conventional distributed amplifier. The eight-section compensated cascode design gives a GBWP equal to 151.0 GHz and GMFP equal to 284.2 GHz. These are improvements of 83 percent and 245 percent, respectively.

The design procedure for the amplifiers of FIGS. 15 and 16 involved gain optimization as well as optimization of return losses and of smooth, controlled transmissions across the input and output lines ($S_{21}$ and $S_{43}$). These are important for stability, power performance and modular system applications. Table I provides a summary of simulated return losses and responses of the seven amplifiers.

TABLE I

Passbands, Return Losses, and Gains of the Example Distributed Amplifiers (FIGS. 15 and 16)

| Amplifier Description | Passband (GHz) | Gain (dB) | Return Losses Input | (dB) Output |
|---|---|---|---|---|
| Four-section conventional, curves A | dc-45 | 5.25 ± 0.5 | >14.9 | 14.6 |
| Four-section compensated, curve B of FIG. 15 | dc-60 | 4.85 ± 0.5 | >8.5 | >15.2 |
| Four-section cascode, curve C of FIG. 15 | 27-62 | 7.18 ± 0.5 | >10.3 | >14.4 |
| Four-section compensated cascode, curve D of FIG. 9 | 30-62 | 8.88 ± 0.5 | >7.0 | >15.9 |
| Eight-section compensated, curve B of FIG. 16 | 10-62 | 7.15 ± 0.5 | >7.4 >9,f <60 | >15.3 |
| Eight-section cascode, curve C of FIG. 16 | 35-60 | 10.71 ± 0.5 | >13.7 | >13.3 |
| Eight-section compensated cascode, curve D of FIG. 16 | 30-64 | 12.95 ± 0.5 | >7.2 | >13.9 |

TABLE II

Comparison of Maximum Distributed Amplifier Output Powers:
Projected Maximum Output Powers of the Conventional
Distributed Amplifier (Curve A of FIG. 16),
The Cascode Distributed Amplifier (Curve C),
and the Compensated Cascode Distributed Amplifier (Curve D)
Are Compared to that of the
Input Line Compensated Distributed Amplifier (Curve B)

| $f$ (GHz) | 25 | 35 | 45 | 55 |
|---|---|---|---|---|
| $P_{max}$ (Curve B of FIG. 16) / $P_{max}$ (Curve A of FIG. 16) | 4.2 | 2.4 | 2.6 | out of passband |
| $P_{max}$ (Curve B of FIG. 16) / $P_{max}$ (Curve C of FIG. 16) | 0.77 | 0.77 | 1.1 | 1.9 |
| $P_{max}$ (Curve B of FIG. 16) / $P_{max}$ (Curve D of FIG. 16) | 1.0 | 1.0 | 1.2 | 1.8 |

The increased gains of the six negative resistance loss-compensated amplifiers of curves B, C, and D in FIGS. 15 and 16 do not necessarily lead to increased maximum output power levels. Power saturation mechanisms, especially those of cascodes and dual-gate FET's, can adversely affect the allowed maximum distributed amplifier input power and thereby lessen the maximum output power. Each FET has limited voltage swings across its nodes for linear performance. The circuit configuration, the component values, the input power level, and the specific location within the circuit influence the FET AC voltages. In the cascode distributed amplifier, the FET AC voltages are especially sensitive to the cascode line length(s). The AC voltage constraints of the second (common-gate) cascode FET often restrict the voltage swing across the first cascode FET to less than its inherent dynamic range. Hence, input power may have to be reduced. This might explain why cascode and dual-gate distributed amplifiers reported in the literature do not have greatly extended output power levels despite showing improved gain-bandwidth products over conventional distributed amplifiers.

A study of projected maximum output powers shows the input compensated distributed amplifier (curve B, FIG. 16) to surpass both the cascode and the compensated cascode (curves C and D, FIG. 16) in performance by as much as 90 percent at high frequencies (55 GHz). Power performance is summarized in Table II. The primary saturation mechanism was assumed to be the AC gate-to-source voltage swing. All of the foregoing distributed amplifier design examples were optimized for GBWP, not for maximum output power.

The use of negative resistance loss compensation on the distributed amplifier lines thus allows substantially higher single-stage gain-bandwidth product performance than the maximum product possible with conventional designs. The impact of this performance enhancement is twofold: improvements in the single-stage gain often promises increased maximum output power, while increases in bandwidth are desirable for modular system design.

The details of the seven exemplary distributed amplifier designs are found in FIGS. 2, 9, 11, 13 and 14 and Tables III and IV. FIG. 2 is the generalized block diagram of the seven amplifiers. A typical gain section detail is given in FIG. 11. Two amplifying circuits, the common-source transistor of FIG. 13 and the cascode circuit of FIG. 14, were used in the design. FIG. 12 shows the common-gate negative resistance circuit. Tables III and IV below list appropriate values for the circuit elements. The microstrip lines 70, 71, 73, 74, and 76 ($TL_j$) and open-ended stubs 53 and 79 ($S_1, S_2$) have widths and lengths given in μm and denoted by 'w' and 'l', respectively. A gallium arsenide (GaAs) substrate of thickness 0.004 in and relative permittivity 12.9 was used in the simulations.

TABLE III

Element Values for the Four-Section Distributed Amplifiers

| | Conventional | (Input Line) Compenstd | Cascode | Compenstd, Cascode |
|---|---|---|---|---|
| $TL_1$ (microns) | w = 12.7<br>l = 128.2 | w = 12.7<br>l = 98.6 | w = 12.7<br>l = 99.6 | w = 12.7<br>l = 98.3 |
| $TL_2$ (microns) | w = 12.7<br>l = 168.8 | w = 12.7<br>l = 155.0 | w = 12.7<br>l = 128.1 | w = 12.7<br>l = 149.6 |
| $TL_3$ (microns) | w = 12.7<br>l = 120.0 | w = 12.7<br>l = 65.0 | absent | absent |
| $S_1$ (microns) | absent | w = 19.8<br>l = 18.5 | absent | w = 35.0<br>l = 14.9 |
| $S_2$ (microns) | absent | w = 19.8<br>l = 27.8 | w = 35.0<br>l = 62.2 | w = 19.8<br>l = 90.7 |
| $R_{st}$ (ohms) | absent | 0 ohms, no loss | 302 | 76 |
| $R_{bias}$ (ohms) | 1000 | 1000 | 1000 | 1000 |
| $C_a$ (pF) | 0.305 | 0.348 | 0.366 | 0.369 |
| Common-source FET amplifying circuit | 60 micron FETs | 60 micron FETs | (not utilized) | (not utilized) |
| Cascode amplifying circuit | (not utilized) | (not utilized) | 60 micron FETs<br>$C_c = 3.0$<br>$TL_c$:<br>w = 12.7<br>l = 87.8 | 60 micron FETs<br>$C_c = 3.0$<br>$TL_c$:<br>w = 12.7<br>l = 340.0 |
| Negative resistance compensation circuit — input line | (not utilized) | 90 micron FETs<br>$C_{1nr} = 2.5$<br>$C_{2nr} = 4.0$<br>$TL_{nr}$:<br>w = 12.7<br>l = 605.6 | (not utilized) | 90 micron FETs<br>$C_{1nr} = 3.0$<br>$C_{2nr} = 3.5$<br>$TL_{nr}$:<br>w = 12.7<br>l = 525.0 |

TABLE IV

Element Values for the Eight-Section Distributed Amplifiers

| | (Input Line) Compenstd | Cascode | Compenstd, Cascode |
|---|---|---|---|
| $TL_1$ (microns) | w = 12.7<br>l = 103.1 | w = 12.7<br>l = 95.6 | w = 12.7<br>l = 101.3 |
| $TL_2$ (microns) | w = 12.7<br>l = 154.9 | w = 12.7<br>l = 99.5 | w = 19.8<br>l = 147.7 |
| $TL_3$ (microns) | w = 12.7<br>l = 19.6 | w = 12.7<br>l = 17.5 | w = 12.7<br>l = 4.3 |
| $S_1$ (microns) | w = 19.8<br>l = 55.7 | absent | w = 35.0<br>l = 26.9 |
| $S_2$ (microns) | w = 19.8<br>l = 83.6 | w = 35.0<br>l = 94.7 | w = 19.8<br>l = 123.0 |
| $R_{st}$ (ohms) | 0 ohms, no loss | 266 | 50 |
| $R_{bias}$ (ohms) | 1000 | 1000 | 1000 |
| $C_a$ (pF) | 0.154 | 0.139 | 0.176 |
| Common-source FET amplifying circuit | 60 micron FETs | (not utilized) | (not utilized) |
| Cascode amplifying circuit | (not utilized) | 60 micron FETs<br>$C_c = 3.0$<br>$TL_c$:<br>w = 12.7<br>l = 118.9 | 60 micron FETs<br>$C_c = 3.0$<br>$TL_c$:<br>w = 12.7<br>l = 330.0 |
| Negative resistance compensation circuit — | 90 micron FETs<br>$C_{1nr} = 2.5$<br>$C_{2nr} = 4.0$ | (not utilized) | 90 micron FETs<br>$C_{1nr} = 3.0$<br>$C_{2nr} = 3.5$ |

TABLE IV-continued

Element Values for the Eight-Section Distributed Amplifiers

|  | (Input Line) Compenstd | Cascode | Compenstd, Cascode |
|---|---|---|---|
| input line | $TL_{nr}$: w = 12.7 l = 579.9 | | $TL_{nr}$: w = 12.7 l = 525.0 |

It is understood that the invention is not confined to the particular embodiments herein illustrated and described, but embraces such modified forms thereof as come within the scope of the following claims.

What is claimed is:

1. A distributed amplifier comprising:
   (a) a plurality of distributed amplifier sections joined by an input line and an output line which extend through the plural distributed amplifier sections, each distributed amplifier section including transmission lines forming the input and output lines and an amplifier connected between the input and output lines;
   (b) input line compensation means electrically connected to the input line at a plurality of nodes spaced along the input line for providing effective negative resistance on the input line to provide compensation for attenuation on the input line.

2. The distributed amplifier of claim 1 including output line compensation means in each of the distributed amplifier sections connected to the output line for providing effective negative resistance to the output line to provide compensation for attenuation on the output line.

3. The distributed amplifier of claim 1 wherein each distributed amplifier section includes an FET connected between the input and output lines in a common-source configuration.

4. The distributed amplifier of claim 1 wherein each distributed amplifier section includes a pair of FETs connected in cascode with a first FET in a common-source configuration with its gate connected to the input line and a second FET connected in a common-gate configuration to receive the output of the first FET and connected to the output line.

5. The distributed amplifier of claim 1 including an open stub transmission line section connected to the output line between each of the distributed amplifier sections.

6. The distributed amplifier of claim 1 wherein the input line compensation means comprises compensation circuits connected to the nodes on the input line and each having a FET and means for biasing the FET in a common-gate configuration with the source and drain of the FET being connected electrically from the input line and through an impedance to ground.

7. The distributed amplifier of claim 6 including an output network comprising the impedance connected between the compensation means FET and ground which includes a transmission line selected to be a quarter-wavelength of the mid-point frequency of the desired frequency band of the distributed amplifier.

8. The distributed amplifier of claim 7 wherein the output network includes a parallel connected resistor and capacitor connected between the transmission line and ground for biasing the compensation means FET.

9. The distributed amplifier of claim 6 including a parallel connected capacitor and resistor electrically connected between the gate of the compensation means FET and ground for biasing the FET.

10. The distributed amplifier of claim 1 wherein the transmission lines in each of the distributed amplifiers comprise microstrips formed on a semiconductor substrate.

11. The distributed amplifier of claim 1 wherein the transmission line in the output line of each distributed amplifier section is formed of two sections electrically joined at a node, and wherein each distributed amplifier section further includes an open ended transmission line stub connected to the node between the output line transmission line sections.

12. The distributed amplifier of claim 1 wherein each distributed amplifier section includes two input line transmission line sections electrically joined together at a node, two output line transmission line sections electrically joined at a node, a transmission line section connected to the node joining the output line transmission line sections, and an amplifying circuit and biasing circuit connected between the transmission line section and the input line node.

13. The distributed amplifier of claim 12 wherein each distributed amplifier section further includes an open ended transmission line stub electrically connected to the node between the two output line transmission line sections.

14. The distributed amplifier of claim 12 wherein the amplifying circuit of each amplifier section includes an FET connected in a common-source configuration.

15. The distributed amplifier of claim 12 wherein the amplifying circuit of each amplifier section includes two FETs connected together in cascode and including a transmission line segment connected between the drain of a first common-source configured FET in cascode and the source of a second common-gate configured FET in the cascode.

16. The distributed amplifier of claim 15 including a biasing circuit for the gate of the common-gate connected FET in the amplifying circuit of each distributed amplifier section which includes a parallel connected resistor and capacitor connected between the gate and ground.

17. A distributed amplifier comprising:
   (a) an input line comprising a series of transmission line sections electrically joined at nodes;
   (b) an output line comprising a series of transmission line sections electrically joined at nodes;
   (c) a plurality of amplifying circuits connected between nodes on the input and output lines to provide an amplified signal from the input line to the output line;
   (d) a plurality of input line attenuation compensation circuits each connected to the input line at a node, each attenuation compensation circuit including a FET and means for biasing the FET in a common-gate configuration with the source and drain of the FET being connected electrically from the input line through an impedance to ground.

18. The distributed amplifier of claim 17 including output line compensation means connected to the output line for providing effective negative resistance to the output line to provide compensation for attenuation on the output line.

19. The distributed amplifier of claim 17 wherein each amplifying circuit includes a FET connected between the input and output lines in a common-source configuration.

20. The distributed amplifier of claim 17 wherein each amplifying circuit includes a pair of FETs connected in cascode with a first FET in a common-source configuration with its gate connected to the input line and a second FET connected in a common-gate configuration to receive the output of the first FET and connected to the output line.

21. The distributed amplifier of claim 17 including an open stub transmission line sections connected to the output line at nodes between the nodes at which each of the amplifying circuits are connected to the output line.

22. The distributed amplifier of claim 17 wherein the input line compensation circuit impedance includes a transmission line selected to be a quarter-wavelength of the midpoint frequency of the desired frequency band of the distributed amplifier.

23. The distributed amplifier of claim 22 wherein the impedance further includes a parallel connected resistor and capacitor connected between the transmission line and ground for biasing the compensation FET.

24. The distributed amplifier of claim 22 further including a parallel connected capacitor and resistor electrically connected between the gate of the compensation circuit FET and ground for biasing the FET.

25. The distributed amplifier of claim 17 wherein the transmission line sections in the input and output lines comprise microstrips formed on a semiconductor substrate.

26. The distributed amplifier of claim 17 further including an open ended transmission line stub connected to each of the nodes to which the amplifying circuits are connected.

27. The distributed amplifier of claim 17 wherein the output line includes two transmission line sections for each amplifying circuit, the input line includes two transmission line sections for each amplifying circuit, the transmission line sections in the input and output lines being joined together electrically at nodes, further including a transmission line segment connected between the node joining two output transmission line sections with the amplifying circuit being connected between the transmission line section and an input line node, and wherein the input line compensation circuits are connected to the nodes of the input line which are adjacent to the nodes to which the amplifying circuits are connected.

28. The distributed amplifier of claim 27 wherein the transmission line sections comprise microstrips formed on a semiconductor substrate.

29. The distributed amplifier of claim 27 further including an open ended transmission line stub connected to each of the nodes in the output line to which the amplifying circuit and transmission line section are connected.

30. The distributed amplifier of claim 27 further including an open ended transmission line stub connected to each of the nodes in the output line which are adjacent to the nodes to which the transmission line section and amplifying circuit are connected.

31. The distributed amplifier of claim 17 wherein each amplifying circuit includes two FETs connected together in cascode with the first FET connected in a common-source configuration and the second FET receiving the output of the first FET and being connected in a common-gate configuration.

32. The distributed amplifier of claim 31 including a transmission line section connected between the first FET and the second FET.

33. The distributed amplifier of claim 31 including a biasing circuit for the gate of each of the common-gate connected FETs in the amplifying circuits which includes a parallel connected resistor and capacitor connected between the gate and ground.

* * * * *